(12) United States Patent
Mahon et al.

(10) Patent No.: US 11,914,005 B2
(45) Date of Patent: Feb. 27, 2024

(54) METHOD AND APPARATUS FOR AUTOMATIC FREQUENCY SELECTION IN MAGNETIC TRACKING SYSTEMS

(71) Applicant: PENUMBRA, INC., Alameda, CA (US)

(72) Inventors: Cameron J. Mahon, Guelph (CA); Oded Y. Zur, Kochav Yair (IL); Alejandro S. Diaz, Ross, CA (US)

(73) Assignee: PENUMBRA, INC., Alameda, CA (US)

( * ) Notice: Subject to any disclaimer, the term of this patent is extended or adjusted under 35 U.S.C. 154(b) by 0 days.

(21) Appl. No.: 18/201,361

(22) Filed: May 24, 2023

(65) Prior Publication Data

US 2023/0296697 A1     Sep. 21, 2023

Related U.S. Application Data

(63) Continuation of application No. 17/834,184, filed on Jun. 7, 2022, now Pat. No. 11,693,063.
(Continued)

(51) Int. Cl.
*G01R 33/00* (2006.01)

(52) U.S. Cl.
CPC ..... *G01R 33/0017* (2013.01); *G01R 33/0088* (2013.01)

(58) Field of Classification Search
CPC .............. G01R 33/0017; G01R 33/0088; G01R 33/00; G01R 33/0041; G01R 33/0029; G01R 33/02; G01R 35/005; G01R 33/0023; G01R 33/0206; G01R 33/028; G01R 27/16; G01R 31/08; G01R 31/083; G01R 31/52; G01R 31/58; G01R 33/28; G01R 1/00; G01R 35/00; G01R 31/00; G01R 33/0005; G01R 33/0011; G01R 33/0047;
(Continued)

(56) References Cited

U.S. PATENT DOCUMENTS

| 4,737,794 A | 4/1988 | Jones |
| 2002/0008661 A1* | 1/2002 | McCall .................. G01S 19/47 701/472 |

(Continued)

FOREIGN PATENT DOCUMENTS

WO     2018102009 A1     6/2018

*Primary Examiner* — Alvaro E Fortich
(74) *Attorney, Agent, or Firm* — HALEY GUILIANO LLP

(57) ABSTRACT

A system and method that can automatically select a frequency of a magnetic field in a magnetic tracking system. A magnetic tracking system emits an alternating magnetic field using a set of three frequencies. In the present approach, a transmitter is capable of generating multiple sets of three frequencies. A processor selects a first set of frequencies to use and causes the receiver to measure the amplitude of the magnetic field at those frequencies. In one embodiment, the frequency set having the lowest energy is selected. The processor then compares an estimated jitter at those frequencies to the actual jitter experienced using the frequencies. If the actual jitter exceeds the estimated jitter by a predetermined amount, the processor switches to a different set of frequencies and causes the receiver to measure the magnetic field at the new set of frequencies. The process may repeat using the additional sets of frequencies.

12 Claims, 2 Drawing Sheets

Related U.S. Application Data

(60) Provisional application No. 63/245,134, filed on Sep. 16, 2021.

(58) Field of Classification Search
CPC .......................... G01R 33/0094; G01R 33/12; G01R 33/1207; G01R 33/1215; G01R 33/1223; G01R 33/1292; G06F 1/163; G06F 3/011; G06F 3/012; G06F 18/214; G06F 3/0346; G06F 3/014; G06F 3/165; G06F 18/2413; G06F 3/0338; G06F 3/04842; G06F 2203/012; G06F 18/231; G06F 18/24323; G06F 18/253; G06F 3/14; G06F 3/016; G06F 3/044
See application file for complete search history.

(56) References Cited

U.S. PATENT DOCUMENTS

| | | | |
|---|---|---|---|
| 2003/0184285 A1* | 10/2003 | Anderson | A61B 34/20 606/1 |
| 2017/0307891 A1* | 10/2017 | Bucknor | G06F 3/012 |
| 2019/0246350 A1 | 8/2019 | Stein et al. | |
| 2020/0158487 A1* | 5/2020 | Zur | G01R 33/028 |
| 2021/0394020 A1* | 12/2021 | Killen | A63B 24/0006 |
| 2023/0089646 A1 | 3/2023 | Mahon et al. | |

\* cited by examiner

METHOD AND APPARATUS FOR AUTOMATIC FREQUENCY SELECTION IN MAGNETIC TRACKING SYSTEMS

CROSS-REFERENCE TO RELATED APPLICATIONS

This application is a continuation of U.S. patent application Ser. No. 17/834,184, filed Jun. 7, 2022, which claims priority to Provisional Application No. 63/245,134, filed Sep. 16, 2021, which are both i-s incorporated by reference herein in their entireties.

FIELD OF THE INVENTION

The present invention relates generally to magnetic tracking devices, and more particularly to the selection of the frequency of the electromagnetic field in such devices.

BACKGROUND OF THE INVENTION

Electromagnetic (EM) tracking systems, sometimes simply called magnetic tracking systems, typically use a method in which alternating magnetic fields are generated and measured using a system of orthogonal coils to generate position and orientation information which is used by a computer system. One common application is tracking a user for the purpose of playing a video game or being immersed in a virtual reality world. Some magnetic tracking systems are alternating current EM tracking systems, although there are other types as well.

In some prior art systems, a transmitter, or emitter, has three orthogonal coils that generate the magnetic field signal and may be located in a fixed position, such as in a local base station, video game console or other apparatus. In some systems, each coil uses a different frequency in a frequency division multiplexing (FDM) approach; the three frequencies may be considered to be a frequency "set." In other systems, each coil may use the same frequency in a different time period or "slot" in a time division multiplexing (TDM) approach. A receiver, also known as a sensor, in a tracking device similarly has three orthogonal magnetic field sensing coils, and provides information about the sensed magnetic field, including amplitude, to a processor, which derives the position and orientation of the tracking device relative to the transmitter from such information.

Such electromagnetic tracking systems, and the processors that determine the position and orientation of such sensors, are well known to those of skill in the art. One such example, U.S. Pat. No. 4,737,794 ("the '794 patent"), teaches a "method and apparatus for determining remote object orientation and position with an electromagnetic coupling." It shows a transmitter comprising a plurality of radiating antennas, located at a source to provide a plurality of magnetic fields spanning three dimensional space and defining a source reference coordinate frame, and a receiver comprising a plurality of sensing or receiving antennas located on an object to be tracked for receiving that field. A processor receives the outputs from the receiving antennas and converts the received components of the transmitted magnetic fields into remote object position and orientation relative to the source reference coordinate frame. The antennas may be, for example, dipole antennas, loop antennas, or coil antennas. The terms "antennas" and "coils" are used interchangeably herein.

There are a number of factors that limit the accuracy of such magnetic tracking systems. In some cases, other "unintentional" sources may produce electromagnetic energy in the same frequency range as that of the desired magnetic field. Such unintentional sources may emit an electromagnetic field even when they are not intended to do so; for example, the ballast in a fluorescent light may emit an electromagnetic field although it is not designed to do so.

An unintentional field source may interfere with the ability of the receiver to correctly determine the amplitude of the sensed magnetic field, and thus the position and orientation of the receiver relative to the transmitter. In such cases, the position and orientation of the receiver may appear to jump around randomly. This jumping, which can be thought of as a "noisy position" of the receiver, is known as jitter and reduces accuracy of the determination of the position and orientation of the receiver.

It is desirable to be able to operate a magnetic tracking system in a way that can limit jitter due to extraneous sources of electromagnetic energy.

SUMMARY OF THE INVENTION

A system and method is disclosed that can automatically select a frequency or frequency set of a magnetic field in a magnetic tracking system to limit jitter.

One embodiment discloses a system for automatically selecting a frequency of a magnetic field in an electromagnetic tracking system, comprising: a transmitter comprising a plurality of source magnetic coils each configured to generate a magnetic field; a receiver comprising a plurality of sensor magnetic coils configured to sense the magnetic field and generate magnetic sensor data representing the position and orientation of the receiver relative to the transmitter; and a processor configured to: cause the transmitter to generate magnetic fields at a plurality of sets of frequencies; cause the receiver to sense the magnetic fields at a first one of the plurality of sets of frequencies; determine an expected amount of jitter at the first set of frequencies; compare the expected amount of jitter at the selected set of frequencies to a measured amount of actual jitter at the first set of frequencies; cause the transmitter to generate magnetic fields at a second one of the plurality of sets of frequencies when the ratio of the measured amount of jitter to the expected amount of jitter exceeds a predetermined jitter ratio; and cause the receiver to sense the magnetic fields at the second one of the plurality of sets of frequencies.

Another embodiment discloses a method of automatically selecting a frequency of a magnetic field in an electromagnetic tracking system, comprising: generating a magnetic field from a plurality of source magnetic coils in a transmitter; generating magnetic sensor data by sensing the magnetic field using a plurality of sensor magnetic coils in a receiver; causing, by a processor, the transmitter to generate magnetic fields at a plurality of sets of frequencies; causing, by the processor, the receiver to sense the magnetic fields at a first one of the plurality of sets of frequencies; determining, by the processor, an expected amount of jitter at the first set of frequencies; comparing, by the processor, the expected amount of jitter at the selected set of frequencies to a measured amount of actual jitter at the first set of frequencies; causing, by the processor, the transmitter to generate magnetic fields at a second one of the plurality of sets of frequencies when the ratio of the measured amount of jitter to the expected amount of jitter exceeds a predetermined jitter ratio; and causing, by the processor, the receiver to sense the magnetic fields at the second one of the plurality of sets of frequencies.

Still another embodiment discloses a non-transitory computer readable storage medium having embodied thereon instructions for causing a computing device to execute a method of automatically selecting a frequency of a magnetic field in an electromagnetic tracking system, the method comprising: generating a magnetic field from a plurality of source magnetic coils in a transmitter; generating magnetic sensor data by sensing the magnetic field using a plurality of sensor magnetic coils in a receiver; causing, by a processor, the transmitter to generate magnetic fields at a plurality of sets of frequencies; causing, by the processor, the receiver to sense the magnetic fields at a first one of the plurality of sets of frequencies; determining, by the processor, an expected amount of jitter at the first set of frequencies; comparing, by the processor, the expected amount of jitter at the selected set of frequencies to a measured amount of actual jitter at the first set of frequencies; causing, by the processor, the transmitter to generate magnetic fields at a second one of the plurality of sets of frequencies when the ratio of the measured amount of jitter to the expected amount of jitter exceeds a predetermined jitter ratio; and causing, by the processor, the receiver to sense the magnetic fields at the second one of the plurality of sets of frequencies.

DETAILED DESCRIPTION OF THE INVENTION

Figure 1:
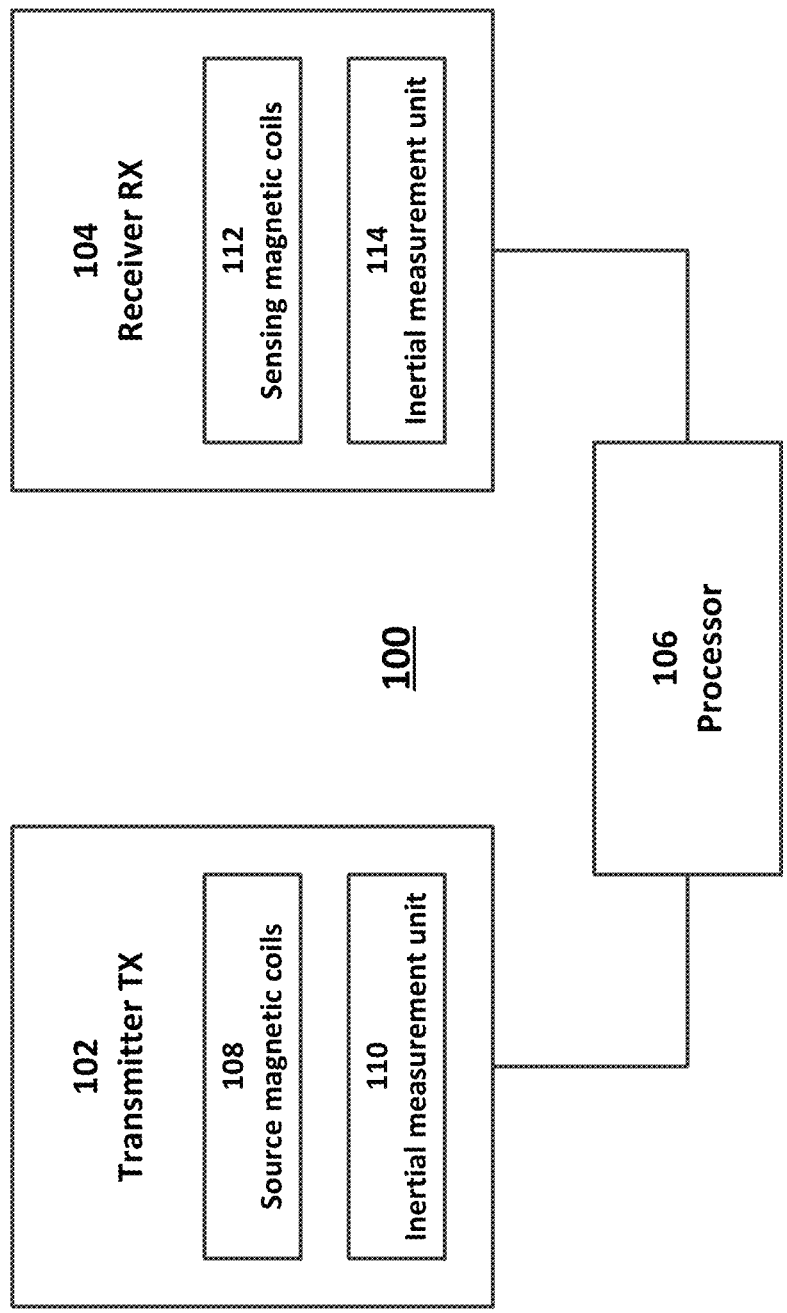
FIG. 1 is a block diagram of a system for automatically selecting a frequency set of a magnetic field in a magnetic tracking system according to one embodiment of the present approach.

A system and method is disclosed that can automatically select a frequency or frequency set of a magnetic field in a magnetic tracking system. (The following discussion assumes that the FDM approach is used and thus refers to frequency sets. However, the present approach is applicable to systems using a TDM approach as well. One of skill in the art will recognize that the same principles may be applied to a TDM approach by, in general, using a single frequency that is time division multiplexed where a frequency set is discussed.)

As above, in an FDM approach a magnetic tracking system emits an alternating magnetic field using a set of three frequencies. In such an embodiment using the present approach, a transmitter is capable of generating multiple sets of three frequencies; in one embodiment there are four sets of frequencies. A processor selects a first set of frequencies to use, and causes the receiver to measure the amplitude of the magnetic field at those frequencies. In one embodiment, the frequency set having the lowest energy is selected.

The processor then compares an estimated jitter at those frequencies to the actual jitter experienced using the frequencies. If the actual jitter exceeds the estimated jitter by a predetermined amount, the processor switches to a different set of frequencies and causes the receiver to measure the magnetic field at the new set of frequencies. In one embodiment, the new set of frequencies is the set having the next lowest energy. The same analysis of jitter may be applied to the new set of frequencies, and if the amount of jitter is still too high, the system may switch to a third set of frequencies, and so on.

In an electromagnetic tracking system the three magnetic fields are sensed and separated to generate a signal that is a 3×3 signal matrix, called "SigMat" herein, which represents a total of nine measures of the three transmitted magnetic fields; each column corresponds to the sensed field from a separate one of the three coils of the transmitter, and each row corresponds to a separate one of the three coils of the receiver. One example of a 3×3 matrix that might represent SigMat is:

| a11 | a12 | a13 |
| a21 | a22 | a23 |
| a31 | a32 | a33 | where a11 through a33 represent the nine measures of the three magnetic fields, one measure of each magnetic field by each of the three receiver coils. It is the evaluation of SigMat that results in a determination of the position and orientation of the receiver.

Determining a SigMat from a particular position and orientation of the receiver is straightforward using the formula for the electromagnetic fields. A transmitter "TX" generates, in good approximation, three simple dipole fields. One of skill in the art will appreciate that it is relatively straightforward to predict the SigMat values from a particular position and orientation by using the formula for dipole fields. The inverse problem, i.e., determining the position and orientation of the receiver from a SigMat, is usually harder, but in the case of three dipole fields generated by orthogonal coils can also be solved analytically. In other cases, iterative methods (e.g., successive approximations) are usually used, and such iterative methods may also be used in the case of orthogonal fields as well.

FIG. 1 is a block diagram of a system for reducing magnetic tracking error due to distortion of the magnetic field in a magnetic tracking system according to one embodiment of the present approach. System 100 contains a transmitter TX 102, a receiver RX 104 and a processor 106; in some embodiments there may be multiple receivers 104. As above, transmitter 102 may be located in a base station, while receiver 104 is attached to some movable object or person. Also as above, transmitter 102 contains source magnetic coils 108 for generating magnetic fields, while receiver 104 contains sensing magnetic coils 112 for sensing the magnetic fields. In the present embodiment, transmitter 102 and receiver 104 each contain an IMU 110 and 114, respectively; IMUs 110 and 114 each have a known physical offset from the respective source magnetic coils and sensing magnetic coils.

System 100 also contains processor 106, which generates a SigMat and performs error reduction as described herein from the data it receives from transmitter 102 and receiver 104, and then generates a position and orientation of the receiver. As above, the transmitter 102 and receiver 104 may communicate with processor 106 wirelessly, or may use a wired connection to do so.

As above, jitter, or random jumping in the receiver position and orientation, is caused by an unintentional or "spurious" energy source in one or more of the three frequencies in the set of frequencies being used to generate the magnetic field. Thus, to reduce the jitter the unintentional energy should be avoided.

In the present approach, this is accomplished by selecting a frequency set used to generate the magnetic field from a plurality of available frequency sets; as above, in one embodiment there are four frequency sets. The selecting of a frequency then arises in two situations; first, choosing a frequency set when commencing operation of a magnetic system, and second, avoiding or reducing interference once the system is operating by changing to a different frequency set.

In some other technology areas, there are systems that check for the clearest frequency channel before selecting the channel to be used; for example, some wi-fi routers do this. It is also generally possible to check the quality of the channel during wi-fi transmission because the data may be verified by use of a checksum, parity check, or some other method.

However, in electromagnetic tracking the quality of the channel cannot be similarly checked because there is no analogous method of verifying the quality of the data with a checksum or parity check. There appear to be no known solutions that address the selection of a frequency, or frequency set, both before and during operation of a magnetic tracking system.

In the present approach, selecting a frequency set to use when the magnetic tracking system commences operation is straightforward and analogous to the selection of a channel in the wi-fi situation. A logic element, such as processor 106 in FIG. 1, checks the amount of energy in each of the available frequency sets and selects the frequency set with the least amount of energy.

The determination of whether there is significant unintentional or spurious energy in the frequency set being used once the transmitter is running is a more difficult problem. The receiver sees a magnetic field having energy, but is unable to determine whether the energy is from the transmitter alone or includes any unintentional energy.

In the present approach, whether there is a significant amount of unintentional energy is determined by comparing the actual amount of energy detected by the receiver with an expected amount of energy.

To determine the amount of jitter in the present approach, the position of the receiver is first established as described above. In some embodiments, this may be accomplished by collecting a set of samples, each sample containing a thousand or more determinations of the position of the receiver relative to the transmitter.

The average distance of the receiver in the samples is used to calculate the amount of actual and estimated jitter. Thus, it is desirable that there not be much motion during the sample. The level of acceptable movement will be dependent upon the distance between the transmitter and the receiver; the greater the distance, the larger the acceptable motion. In some embodiments, it may be preferable to simplify matters by using a constant value, and keeping the velocity of the receiver prior to the sample at no greater than 1.0 millimeter per second (mm/sec). One way to infer movement is to check the acceleration reading of the IMU during the sample; in one embodiment the IMU may be monitored to ensure that the receiver acceleration is 9.8 meters per second squared (m/sec$^2$, the acceleration due to gravity) plus or minus 0.1 m/sec$^2$, and that the acceleration vector does not vary by more than 2 degrees. These tolerances are based upon the noise of the IMU as specified on its datasheet, and may thus vary depending upon the noise specification of the specific IMU used.

Calculating the amount of actual jitter in the position of the receiver is straightforward using the standard deviation of the position samples, calculated as:

$$\sqrt{\frac{\sum_{i=1}^{N}((x_i - \bar{x})^2 + (y_i - \bar{y})^2 + (z_i - \bar{z})^2)}{N}}$$

where:
$x_i$, $y_i$, and $z_i$ are the coordinates of the positions of the receiver; and
$\bar{x}$, $\bar{y}$, and $\bar{z}$ are the means of the positions.

To calculate the expected amount of jitter, the signal to noise (S/N) ratio on the receiver must be calculated. Jitter is caused by a low S/N ratio in the measurements used to calculate the position of the displayed device. Lower signal or higher noise leads to an increase in jitter.

The signal on the receiver is the energy of the magnetic field seen by the receiver. The noise on the receiver is a combination of the extraneous energy and the amount of noise in the receiver electronics, for example, the amplifier in the receiver that amplifies the signal from the magnetic sensing coils.

The noise from the receiver electronics is made up of several components:
1) Johnson-Nyquist noise;
2) Current and voltage noise of the amplifier(s); and
3) Noise of the analog-to-digital converter (ADC) in the receiver.

Johnson-Nyquist noise (also referred to as thermal noise, Johnson noise, or Nyquist noise) is the electronic noise generated by the thermal agitation of the charge carriers (usually the electrons) inside an electrical conductor at equilibrium, which happens regardless of any applied voltage. It is largely noise due to the resistances in the circuit, and is calculated as:

$$\sqrt{4k_B T \Delta f R}$$

where:
$k_g$ is Boltzmann's constant;
T is the temperature in degrees Kelvin;
R is the resistance; and
$\Delta f$ is the frequency band of interest.

The current and voltage noise of the amplifier(s) is as specified in the datasheet(s) of the specific amplifiers used. Similarly, the noise of the ADC is as specified in its datasheet.

All of these types of noise are relatively constant for a given receiver within a normal range of temperature. In the present approach, to get the total noise on the receiver, the Johnson-Nyquist noise, the noise of the amplifiers, and the ADC noise are transformed to a common point, such as the input, and their values in decibels (dB) then added together like orthogonal vectors.

The signal on the receiver, as above the energy of the magnetic field seen by the receiver, is not constant. The energy of the magnetic field from the transmitter decreases with the cube of the distance between the transmitter and receiver and thus is proportional to 1/distance$^3$. It will be apparent that, given a constant noise level and a signal that decreases with the cube of the distance, the S/N ratio and the subsequent jitter will get worse with increasing distance.

Using this information, it is possible to determine the expected level of jitter once the distance between the transmitter and receiver has been approximated. This calculation is:

Expected jitter=$K*\text{Distance}^3$ where K is a stored constant that measures the jitter of the receiver at a unit distance from the transmitter.

The measurement of the constant K will typically be done during production of the receiver prior to shipping, rather than during setup or use. The unit distance used in the measurement will be the same units used in the measurement of Distance in applying the Expected Jitter equation (whether meters, yards, feet, etc.). Thus, if the constant K is measured at a distance of 1 meter, and the Expected Jitter is calculated for a distance of the receiver from the transmitter of 0.2 meters, then the Expected Jitter will equal K times $0.2^3$.

In one embodiment of the present approach, a ratio of the amount of actual jitter to the amount of expected jitter is calculated. The determination of whether there is too much jitter is based upon whether that ratio exceeds a predetermined threshold. In one embodiment, the ratio is two to one, i.e., if the actual jitter is at least two times the expected jitter, then the jitter is considered to be within an acceptable limit. In this case, no change is made to the frequency set, and the system continues to operate without changing the frequency set.

On the other hand, if the ratio of the actual jitter to the expected jitter exceeds the threshold, here two, then it is assumed that there is significant unintentional energy and it is desirable to select another frequency set to avoid that unintentional energy.

The threshold ratio of actual jitter to expected jitter at which the frequency set is changed may be selected as desired by a designer of a magnetic tracking system. There are variations in the hardware of different systems, the tolerance of components, temperature variations, and other variables. A designer may choose to select a ratio that is less than or greater than two.

If the jitter ratio exceeds the threshold, then under the present approach a determination is made of which of the remaining available frequency sets should be used next; the prior frequency set which resulted in a jitter ratio over the threshold is excluded. As in the case of the initial operation of the system, the best frequency set to use next will typically be the frequency set with the lowest energy of the remaining frequency sets.

For example, suppose there are four frequency sets A, B, C and D, and frequency set A is selected first as having the lowest energy. If, during operation, the jitter ratio exceeds the threshold, then a new frequency set will be selected that is the frequency set with the lowest energy from the remaining frequency sets B, C and D; frequency set A is no longer an option. The processor will cause the transmitter to generate the magnetic field using the new frequency set and cause the receiver to sense the magnetic field using the new frequency set. If all of the frequency sets have jitter exceeding the threshold, the system may generate a warning that the environmental interference is too high for the system to operate as expected.

A more advanced embodiment allows the initial frequency sets to be modified by combining frequencies from different frequency sets, i.e., one frequency from a first set and another frequency from another set, and even a third frequency from a third set. In some instances this may be desirable because it is possible that only one frequency in a given frequency set is the cause of excessive jitter. However, a problem is that when the determination of too much magnetic interference is based on positional jitter, the calculation of that positional jitter hides which frequency is the cause of the jitter. To solve this problem, the jitter is tested not from the positional data as above, but rather from SigMat data. Using the above SigMat nomenclature, the noise from the SigMat is:

$$\sqrt{\frac{\sum_{i=1}^{N}\left(\sum_{j=1}^{3}\sum_{k=1}^{3}(ajk_i - \overline{a_Jk})^2\right)}{N}}$$

where ajk are the elements of the SigMat: a11, a12, . . . a33

To find the amount of jitter caused by one of the frequencies in a frequency set, the squares of the elements of that column in the SigMat are summed. As an example, the SigMat jitter for frequency 1 in a given frequency set is:

$$\sqrt{\frac{\sum_{i=1}^{N}\left(\sum_{j=1}^{3}(aj1_i - \overline{a_J1})^2\right)}{N}}$$

The threshold levels for the SigMat jitter will be derived in a similar manner as that from the position because there is a one-to-one relationship between a position and its corresponding SigMat.

After going through the frequency options in this manner, either using predefined sets or, in another embodiment, combining individual frequencies from different sets, the level of noise will be known for that location. The system will find the set of frequencies (in the first embodiment) or the individual frequencies (in the other embodiment) with the lowest amount of noise and stay at those frequencies.

Figure 2:
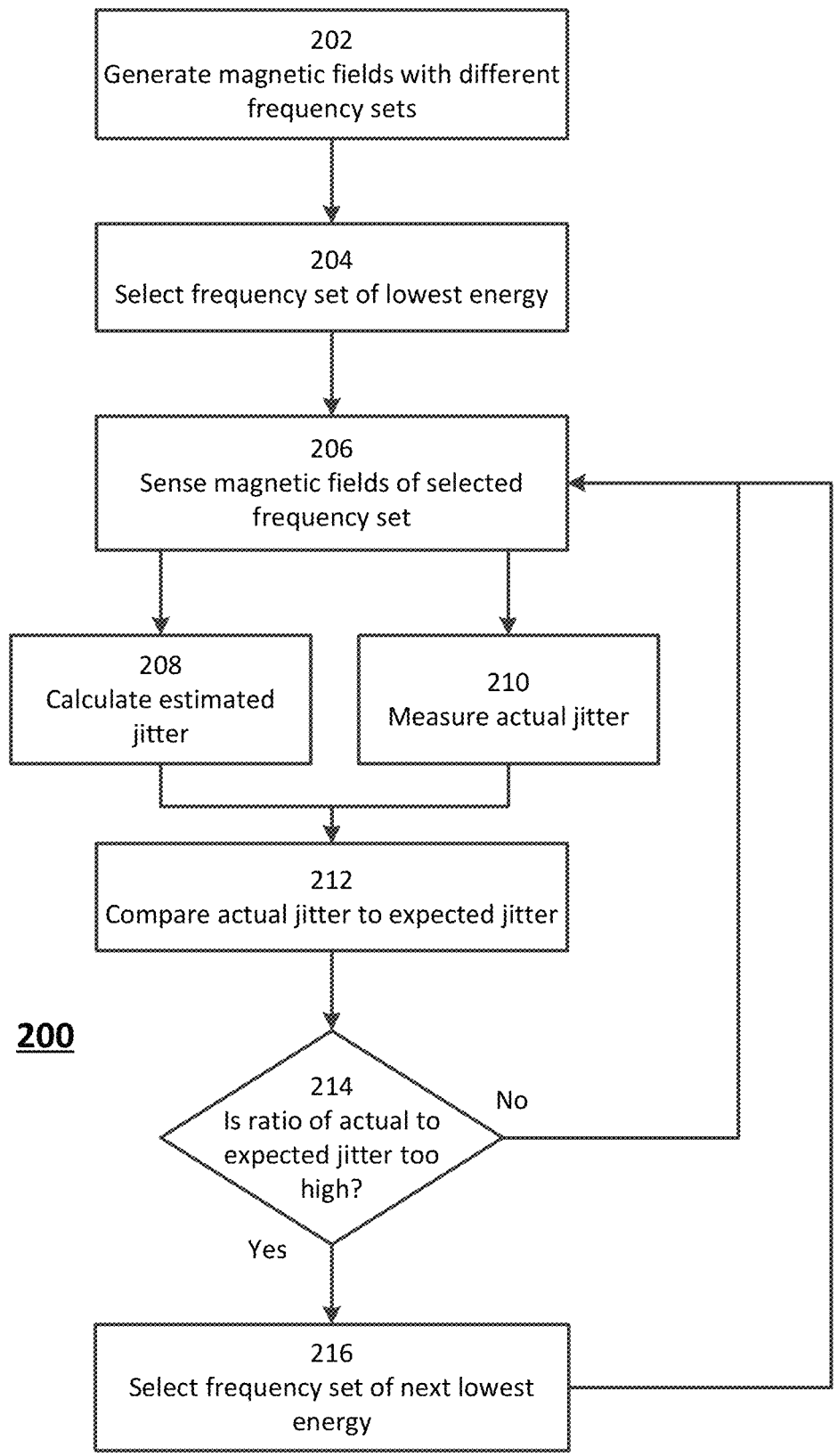
FIG. 2 is a flowchart of a process for automatically selecting a frequency set of a magnetic field in a magnetic tracking system in an electromagnetic tracking system according to one embodiment.

FIG. 2 is a flowchart of a process 200 for automatically selecting a frequency of a magnetic field in a magnetic tracking system in an electromagnetic tracking system according to one embodiment.

At step 202, a processor, such as processor 106 in FIG. 1, causes the coils of a transmitter, such as coils 108 of transmitter 102 in FIG. 1, to generate magnetic fields with several different predetermined frequency sets. As above, each frequency set will have 3 frequencies, one for each of the X, Y and Z axes.

At step 204, the processor selects one of the frequency sets to be used to determine the position and orientation of the receiver, such as receiver 104 of FIG. 1. As above, in one embodiment the frequency set selected will typically be the frequency set having the least energy of the predetermined frequency sets.

At step 206, the processor causes the coils of a receiver, such as sensing coils 112 of receiver 104 in FIG. 1, to sense the magnetic fields that correspond to the selected frequency set. As above and as well known in the art, samples of the magnetic field are taken by the receiver, from which the position and orientation of the receiver may be determined.

At step 208 the processor calculates an estimated amount of jitter that the receiver is expected to experience with the frequencies in use as described above. At step 210 the processor determines the actual jitter in the position and orientation of the receiver from the data provided by the receiver as above.

At step 212 the processor compares the actual jitter to the estimated jitter. In one embodiment, this is expressed as a ratio of the actual jitter to the estimated jitter as above. At step 214 the processor determines whether this ratio is above a predetermined threshold; for example, in one embodiment as above, if the ratio of actual jitter to estimated jitter is over 2, the actual jitter is considered to be too high, implying interference with the frequencies of the magnetic field as described above.

When the actual jitter does not exceed the threshold, i.e., is not too high, the process returns to step 206 and samples continue to be taken by the receiver of the magnetic fields at the selected frequencies.

However, when the actual jitter exceeds the threshold, at step 216 the processor causes the system to switch to another set of frequencies. Thus, the processor will cause the receiver to sense the magnetic fields at the new set of frequencies. In one embodiment, the new set of frequencies will be the set of frequencies having the next lowest energy. The process then returns to step 206 where the receiver senses the magnetic fields at the new set of frequencies, again until and unless the jitter exceeds the predetermined threshold.

One of skill in the art will appreciate that these steps may be implemented in slightly different ways, for example, with respect to the specific order of some steps, what thresholds are provided, when the processor should indicate a lack of solution, etc. It will also be appreciated that it is expected that the steps of process 200 will generally run continuously many times per second when a magnetic tracking system is used with the present approach, and that faster processors will result in more corrections per second, and thus a more accurate real-time indication of the position and orientation of a receiver.

In the present approach, the processor can manage the switch to a new frequency set so that the user is unaware of the change. Since the user does not expect to see a dramatic change in the position and orientation of the receiver, the processor can arrange to change the frequency set so that the user does not notice.

One situation that can arise is when the receiver is in motion during the change in frequency set. The switch to a new frequency set requires some amount of time, even if small, to switch the transmitter and receiver to the new frequencies, and additional time for the receiver to collect sufficient data to determine a new position and orientation using the new frequency set. This period may range from several milliseconds (ms) to several tens of ms. The receiver will continue to move during these amounts of time, and it is desirable that the user does not perceive an unexpected jump in the position of the receiver.

The processor can "smooth out" any change in the apparent position and orientation of the receiver during this time. The processor can first estimate where the receiver will be during the change in frequency set by "dead reckoning," i.e., by using the prior position and trajectory of the receiver relative to the transmitter to predict its probable position and orientation during the time period of the change in frequency set.

Once the processor receives new data from the receiver using the new frequency set and can again determine the actual position and orientation of the receiver, it can gradually merge the trajectory of the predicted position and orientation of the receiver into the actual trajectory of the receiver so that the user only perceives smooth and expected motion of the receiver. One of skill in the art will appreciate that there are various methods of performing such merging, including linear, quadratic and cubic spline methods.

In some embodiments it is possible to avoid this issue and change frequencies so that there is no time required at all, but this requires the added complexity of transmitting two frequencies on each transmitter winding and demodulating a total of six frequencies at the same time on the receiver.

Another issue that may arise is that of the magnetic field signal phases sensed by the receiver. As is known in the art, the "sign" of magnetic field indicates its direction and orientation, so that an ambiguity of sign for a particular frequency means there is an ambiguity of 180 degrees around the axis (x, y or z) corresponding to that frequency, creating an uncertainty in the location of the receiver relative to the transmitter.

This ambiguity is an issue known in the art when a magnetic tracking system commences operation, and there are known techniques for resolving it. In a wired system, this ambiguity is easily remedied by a synchronization ("sync") signal between the transmitter and receiver that enables the receiver to extract the relative signs of the magnetic fields. (In some embodiments, other means are used to pass this information.)

In a wireless system, there is no sync signal between the transmitter and receiver. One solution is to place the receiver in a known position and orientation when the system commences operation; however, this requires involvement of a user. Another solution is to essentially take the signs of a SigMat before the frequency set is changed and then restore the signs to a new SigMat after the frequency set change. One of skill in the art will understand how this may be accomplished, as well as other available solutions to the sign issue.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above. It will also be apparent that in some instances the order of steps described herein may be altered without changing the result of performance of all of the described steps.

There may be a single processor, or multiple processors performing different functions of the functions described herein. One of skill in the art will appreciate how to determine which and how many processors will be appropriate for a specific intended application, and where in a given system they might be located. In some embodiments a single processor may perform all of the processing functions described herein; in other embodiments, the receiver may contain a separate processor to compute the SigMat from the sensor data.

It should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A system comprising:
a transmitter comprising a plurality of source magnetic coils to generate a magnetic field;
a receiver comprising a plurality of sensor magnetic coils to sense the magnetic field and to generate magnetic sensor data representing a position and an orientation of the receiver relative to the transmitter; and
a processor to:
   (a) cause the transmitter to generate the magnetic field associated with a first frequency,
   (b) cause the receiver to sense the magnetic field based on the first frequency,
   (c) determine an expected jitter from the magnetic field at the first frequency,
   (d) measure an actual jitter from the magnetic field at the first frequency,
   determine that there is excessive actual jitter based on a comparison of the expected jitter and the actual jitter,
   in response to determining that there is excessive jitter, repeating (a) through (d) for a frequency different from the first frequency until it is determined that there is no excessive actual jitter, and
   provide an indication of the position and the orientation of the receiver relative to the transmitter based on the magnetic sensor data and based on the frequency at which there is no excessive actual jitter.

2. The system of claim 1, wherein the magnetic field is a time multiplexed magnetic field associated with the first frequency.

3. The system of claim 1, wherein the first frequency has an associated amount of energy, and wherein each of the frequencies different from the first frequency has a higher associated amount of energy than that of the first frequency.

4. The system of claim 1, wherein determining that there is excessive actual jitter comprises determining that the actual jitter is at least twice as much as the expected jitter.

5. A method, comprising:
   (a) causing, using processing circuitry, a transmitter to generate a magnetic field associated with a first frequency;
   (b) causing, using the processing circuitry, a receiver to sense the magnetic field based on the first frequency;
   (c) determining, using the processing circuitry, an expected amount of jitter from the magnetic field at the first frequency;
   (d) measuring, using the processing circuitry, an actual jitter from the magnetic field at the first frequency;
   determining, using the processing circuitry, that there is excessive actual jitter based on a comparison of the expected jitter and the actual jitter;
   in response to determining that there is excessive actual jitter, repeating (a) through (d) for a frequency different from the first frequency until it is determined that there is no excessive actual jitter;
   providing, using the processing circuitry, an indication of the position and the orientation of the receiver relative to the transmitter based on the magnetic sensor data and based on the frequency at which there is no excessive actual jitter.

6. The method of claim 5, wherein the magnetic field is a time multiplexed magnetic field associated with the first frequency.

7. The method of claim 5, wherein the first frequency has an associated amount of energy, and wherein each of the frequencies different from the first frequency has a higher associated amount of energy than that of the first frequency.

8. The method of claim 5, wherein determining that there is excessive actual jitter comprises determining that the actual jitter is at least twice as much as the expected jitter.

9. A non-transitory computer readable storage medium having embodied thereon instructions for causing a computing device to execute a method, the method comprising:
   (a) causing a transmitter to generate a magnetic field associated with a first frequency;
   (b) causing a receiver to sense the magnetic field based on the first frequency;
   (c) determining an expected amount of jitter from the magnetic field at the first frequency;
   (d) measuring an actual jitter from the magnetic field at the first frequency;
   determining that there is excessive actual jitter based on a comparison of the expected jitter and the actual jitter;
   in response to determining that there is excessive actual jitter, repeating (a) through (d) for a frequency different from the first frequency until it is determined that there is no excessive actual jitter;
   providing an indication of the position and the orientation of the receiver relative to the transmitter based on the magnetic sensor data and based on the frequency at which there is no excessive actual jitter.

10. The non-transitory computer readable storage medium of claim 9, wherein the magnetic field is a time multiplexed magnetic field associated with the first frequency.

11. The non-transitory computer readable storage medium of claim 9, wherein the first frequency has an associated amount of energy, and wherein each of the frequencies different from the first frequency has a higher associated amount of energy than that of the first frequency.

12. The non-transitory computer readable storage medium of claim 9, wherein determining that there is excessive actual jitter comprises determining that the actual jitter is at least twice as much as the expected jitter.

* * * * *